US010506356B2

(12) United States Patent
Walser et al.

(10) Patent No.: US 10,506,356 B2
(45) Date of Patent: Dec. 10, 2019

(54) MEMS MICROPHONE AND METHOD FOR SELF-CALIBRATION OF THE MEMS MICROPHONE

(71) Applicant: TDK Corporation, Tokyo (JP)

(72) Inventors: Sebastian Walser, München (DE); Christian Siegel, Tuntenhausen (DE); Matthias Winter, Grosskarolinenfeld (DE)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 16/086,975

(22) PCT Filed: Mar. 30, 2017

(86) PCT No.: PCT/EP2017/057543
§ 371 (c)(1),
(2) Date: Sep. 20, 2018

(87) PCT Pub. No.: WO2017/167876
PCT Pub. Date: Oct. 5, 2017

(65) Prior Publication Data
US 2019/0132693 A1    May 2, 2019

(30) Foreign Application Priority Data

Mar. 31, 2016   (DE) .......................... 10 2016 105 904

(51) Int. Cl.
*H04R 29/00*    (2006.01)
*H04R 19/00*    (2006.01)
(Continued)

(52) U.S. Cl.
CPC ....... *H04R 29/004* (2013.01); *G01R 27/2605* (2013.01); *H04R 19/04* (2013.01); *H04R 2201/003* (2013.01)

(58) Field of Classification Search
None
See application file for complete search history.

(56) References Cited

U.S. PATENT DOCUMENTS

2008/0075306 A1    3/2008  Poulsen
2010/0166228 A1    7/2010  Steele
(Continued)

FOREIGN PATENT DOCUMENTS

DE    102013207233 A1    10/2013
DE    102014103445 A1    10/2014
(Continued)

OTHER PUBLICATIONS

International Search Report for International Application No. PCT/EP2017/057543, dated May 24, 2017, with English translation (5 pages).

(Continued)

*Primary Examiner* — Curtis A Kuntz
*Assistant Examiner* — Kenny H Truong
(74) *Attorney, Agent, or Firm* — Nixon Peabody LLP

(57) ABSTRACT

In a capacitively operating MEMS microphone, by varying the BIAS voltage, the pull-in point is determined and the present pull-in voltage and the corresponding pull-in capacitance between membrane and back electrode are ascertained. From the deviation of the present pull-in point from the values of a first pull-in point, these values being determined after an end test and stored in an internal memory of the MEMS microphone, and the likewise stored values at a first operating point a recalibrated BIAS voltage is determined and set in order thereby to bring the sensitivity closer again to that at the original first operating point.

8 Claims, 2 Drawing Sheets

Figure 1:
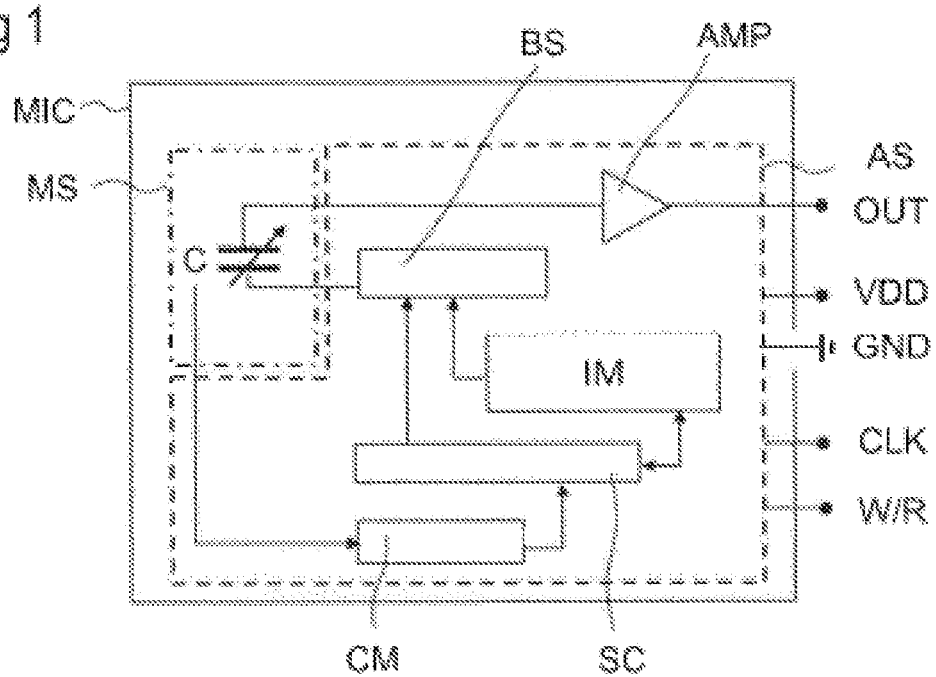

(51) Int. Cl.
*H04R 19/04* (2006.01)
*G01R 27/26* (2006.01)

(56) References Cited

U.S. PATENT DOCUMENTS

| | | | |
|---|---|---|---|
| 2013/0277776 A1* | 10/2013 | Herzum | H04R 19/005 |
| | | | 257/416 |
| 2014/0064523 A1* | 3/2014 | Kropfitsch | H03G 1/0094 |
| | | | 381/174 |
| 2014/0266263 A1 | 9/2014 | Wurzinger | |
| 2016/0018281 A1 | 1/2016 | Hammerschmidt | |
| 2017/0276723 A1* | 9/2017 | Buffa | G01D 5/24 |

FOREIGN PATENT DOCUMENTS

| | | |
|---|---|---|
| DE | 102015111620 A1 | 1/2016 |
| EP | 1906704 A1 | 4/2008 |
| WO | WO 2015/138116 A1 | 9/2015 |

OTHER PUBLICATIONS

Written Opinion of International Searching Authority for International Application No. PCT/EP2017/057543, dated May 24, 2017, with English translation (14 pages).
Walser, S. et al.; "A novel method for reducing the sensitivity deviation of MEMS microphones by programming"; Sep. 6-9, 2015, Proceedings of Eurosensors Conference, Freiburg, Germany; Procedia Engineering 120 (2015) 206-209 (4 pages).

* cited by examiner

MEMS MICROPHONE AND METHOD FOR SELF-CALIBRATION OF THE MEMS MICROPHONE

CROSS-REFERENCE TO RELATED APPLICATIONS

This application is a U.S. National Stage of International Application No. PCT/EP2017/057543, filed Mar. 30, 2017, which claims the benefit of Germany Patent Application No. 102016105904.8, filed Mar. 31, 2016, both of which are incorporated herein by reference in their entireties.

Capacitively operating MEMS microphones have a MEMS sensor, the membrane of which, said membrane picking up sound, forms a capacitance with respect to one or two adjacent back electrodes. The capacitance changes depending on the deflection. From the measured change in capacitance, a voltage representing a measure of the acoustic signal is calculated and amplified in an ASIC.

For setting a desired sensitivity, a BIAS voltage is applied to the MEMS sensor between membrane and back electrode in order to electrically bias the membrane. The BIAS voltage can also be used to adapt the MEMS microphone to a specific environment or the conditions prevailing there.

On account of production tolerances, MEMS microphones may have a fluctuation in their characteristic properties. For high-quality MEMS microphones, therefore, a calibration of the MEMS microphones is absolutely necessary.

However, even well-calibrated MEMS microphones may exhibit aging, in the course of which the sensitivity changes depending on environment influences, in particular mechanical, thermal and moisture influences, even with the BIAS voltage being unchanged. This can reach impermissible deviations from the desired values.

Heretofore, however, no method has been disclosed for recalibrating such aged MEMS microphones and resetting the desired sensitivity, since this requires a known acoustic environment and calibrated reference microphones. The latter is not available in normal operation of the microphone on the part of the user or after installation in a device or some other circuit environment.

Therefore, it is an object of the present invention to specify a MEMS microphone with which a method for subsequent calibration in an arbitrary environment can be carried out.

This object is achieved according to the invention by means of a MEMS microphone and a method for self-calibration according to the two independent claims. Advantageous configurations of the invention are evident from further claims.

It is a fundamental concept of the invention to use the capacitance of the MEMS sensor that is present between membrane and back electrode as a measure of the sensitivity of the microphone. Although the same principle also functions with other types of transformation (capacitance, voltage, current, charge), the change in capacitance is advantageously used.

Normally, ascertaining the absolute value for the sensitivity of the MEMS microphone from the capacitance is accomplished only in a defined acoustic environment.

It is possible using relatively simple means, however, to ascertain the pull-in voltage of the MEMS sensor at any point in time. This is the voltage at which membrane and back electrode, as a result of the electrical and thus also mechanical bias, come so close together that direct contact occurs. This leads either to a short circuit or to a significant increase in the capacitance at the pull-in point.

For recalibration it is proposed, then, to compare the deviation of the measurement values at the pull-in point from the measurement values—originally determined in an end test—for the first and original pull-in point. This results in a drift for the pull-in voltage, that is to say the BIAS voltage at which the pull-in occurs, and also a deviation in the case of the capacitance measured at the pull-in point or the change in capacitance between the previous bias setting and the bias setting directly before the PULL-IN.

These measurement values and the stored values from the end test then serve for ascertaining a new operating point, at which the drift of the pull-in point in respect of the pull-in voltage and of the pull-in capacitance determined is compensated for.

The absolute drift of the pull-in voltage can be used as first compensation component. The drive is added to the previous operating voltage.

With regard to the drift of the pull-in capacitance, as second additive compensation component use is made of the voltage difference that would be necessary in order to compensate for the measured capacitance drift of the pull-in point at the time of an end test that was carried out in a defined acoustic environment directly after the production of the MEMS microphone.

In order to ascertain said voltage difference, therefore, recourse is had to the measurement values for the first pull-in point and the first operating point that were stored during the end test. The gradient of the graph representing the dependence of the capacitance on the BIAS voltage present is then used to interpolate to the behavior of the aged MEMS sensor. The gradient can be determined from the straight line connecting the first pull-in point and the first operating point. The voltage difference for compensating for the capacitance drift serves as further additive compensation component. A recalibrated BIAS voltage for the new operating point is thus obtained by summing the previous operating voltage and the two compensation components.

For accurately carrying out the method, the BIAS voltage present at the MEMS microphone is increased step by step until the present pull-in point is reached and the present pull-in voltage $V_{pa}$ and the corresponding present pull-in capacitance $C_{pa}$ of the MEMS microphone are ascertained. These two measurement values can be reliably ascertained at an arbitrary point in time and at an arbitrary location and thus at an arbitrary stage during the operation of the MEMS microphone.

These values of the present pull-in point are then compared with measurement values from the end test that were stored permanently in the internal memory of the ASIC. The stored measurement values comprise at least the original pull-in voltage, the pull-in capacitance and also the BIAS voltage at the operating point (first operating voltage $V_{S1}$) and the associated operating capacitance (first operating capacitance $C_{S1}$). These known values are then used to ascertain how the BIAS voltage present must be altered in order to achieve the capacitance difference between pull-in capacitance and first operating capacitance.

The first operating voltage $VS_1$ present is then increased (or possibly decreased) by the correction value and set as new operating voltage $VS_{new}$.

The pull-in is detected e.g. by means of a sensitivity measurement. The bias voltage is increased in constant fashion and the sensitivity is determined for each point. In the case of a pull-in, this yields a sensitivity jump (this jump is also manifested in other types of microphone transducer:

capacitive, current, voltage, charge). The sensitivity and bias voltage measured in the jump can be used with the desired sensitivity and bias voltage for calibration.

In order to check the effectiveness or exactness of the method, the method according to the invention is carried out for a series of aged microphones. In parallel therewith, the actual sensitivity is checked by a test in a standardized acoustic environment. During the test it is found that an originally set sensitivity over all tested microphones of an originally measured −38+/−0.05 dBV/Pa varies as a result of aging and the sensitivity then fluctuates in a range of −38+/−1.97 dBV/Pa. This deviation from the set sensitivity or such a measurement value tolerance is distinctly too high.

After carrying out the self-calibration algorithm according to the invention by means of the sensitivity measurement mentioned, the deviation from the desired sensitivity is significantly reduced and is now only −38+/−0.31 dBV/Pa. Although the original sensitivity or the original small deviation from the desired sensitivity is no longer obtained, the deviation from the desired sensitivity is significantly reduced. The effectiveness of the method according to the invention is thus proved.

A prerequisite for a successful calibration of the microphone is the values of an end test carried out under defined conditions, said values being stored in the ASIC of the MEMS microphone. During the end test, a first pull-in voltage $V_{P1}$ is ascertained by continuously determining the capacitance at the MEMS sensor while the BIAS voltage is increased in defined steps. In parallel therewith, the sensitivity is determined over the standardized measurement environment. What operating voltage is to be set for a desired sensitivity is identified from the measurement values. As a substitute value for the desired sensitivity, the capacitance value (first operating capacitance $Cs_{S1}$) determined at the desired sensitivity is taken and stored in the internal memory of the ASIC. Capacitance and BIAS voltage at the pull-in point are correspondingly stored. The value required for compensation of the changed capacitance at the pull-in point (present pull-in capacitance) is obtained from the gradient of the measurement curve between the operating point and the pull-in point during the end test.

The method for self-calibration can be repeated as often as desired. In this case, however, recourse is always had to the stored first values from the end test in order to perform the respective recalibration. The corresponding measurement values from a recalibration carried out previously can be discarded.

The recalibrated BIAS voltage $VS_{new}$, which is suitable for again approaching a desired sensitivity, can be calculated for example according to the following formula:

$$V_{snew} = V_{S1} - (V_{P1} - V_{P2}) + (C_{P1} - C_{P2}) \times (V_{P1} - V_{P2})/(C_{P1} - C_{P2})$$

In this case, the value $(V_{P1} - V_{P2})$ corresponds to the voltage drift of the pull-in point, while the value $(C_{P1} - C_{P2})$ corresponds to the capacitance drift of the pull-in point. In this case, the quotient of $(V_{P1} - V_{P2})$ and $(C_{P1} - C_{P2})$ corresponds to the gradient of the measurement curve from the end test, indicating the dependence of the capacitance determined on the BIAS voltage present.

If the calibration method uses sensitivity, inductance, current, voltage or charge instead of the capacitance values, the formula is analogously transformed.

The recalibration or self-calibration can be carried out repeatedly. As trigger for a recalibration it is possible to use specific rules that detect the reaching of a specific acoustic or thermal stress loading. It is also possible, however, to carry out a recalibration at fixed time intervals. Alternatively, a recalibration can, of course, be initiated at any time by a user. This will be advisable if the microphone is subjected to a severe mechanical loading or a severe thermal loading and a property drift is to be expected. Alternatively or additionally, the recalibration or self-calibration can be carried out upon every restart of the device if a volatile memory is used, from which the values of the last calibration are then erased.

Both in the end test and during every recalibration, the BIAS voltage present at the MEMS sensor is increased step by step until the pull-in point is reached. The respective capacitance is determined after each step. Since, when the pull-in point is reached, the capacitance of the MEMS sensor jumps to a very large value, if an insulator/dielectric where epsilon >1 is usually situated between membrane and counterelectrode, it is necessary to use, as pull-in capacitance usable for the method, the respectively previous capacitance value directly before the pull-in is reached, which directly precedes the reaching of the pull-in point. Preferably, the BIAS voltage is increased in constant steps both during the end test and during the recalibration. It is also possible, however, to use different steps, provided that the reaching of the pull-in point is not yet expected directly.

A MEMS microphone according to the invention with self-calibration device comprises a capacitively operating MEMS sensor and an ASIC connected thereto. A BIAS voltage is able to be applied to the MEMS sensor. In order to be able to carry out the method for self-calibration, the ASIC is designed for the following steps:

a) increasing in steps the BIAS voltage present at the MEMS sensor,
b) determining the capacitance or change in capacitance that forms here in each case at the MEMS sensor,
c) ascertaining the present pull-in point by way of the capacitance measurement,
d) storing the measurement values for BIAS voltage $VP_1$ and associated capacitance $CP_1$ or change in capacitance at the pull-in point in a nonvolatile internal memory of the ASIC,
e) carrying out an algorithm for recalibration for calculating a recalibrated BIAS voltage $VS_{new}$ using the presently determined measurement values and already stored measurement values from the end test,
f) applying the recalibrated BIAS voltage $VS_{new}$ to the MEMS microphone.

Since a first calibration in a defined acoustic environment is possible even with an already known MEMS microphone, even a known MEMS microphone already comprises means for varying the BIAS voltage present. Even in known MEMS microphones, at least this value is stored in an internal memory of the ASIC. For the MEMS microphone according to the invention, all that is now required is an extended memory, and also an algorithm stored in the ASIC, which correspondingly converts present measurement values and stored measurement values in order to ascertain a new calculated BIAS voltage for a newly calculated operating point. Finally, the newly ascertained operating voltage is set in the MEMS microphone, thereby ending the recalibration. It is also possible to permanently store the new calibration values in the memory of the ASIC or else e.g. of the telephone in which the microphone is installed.

The invention is explained in greater detail below on the basis of an exemplary embodiment and with reference to the associated figures.

Figure 2:
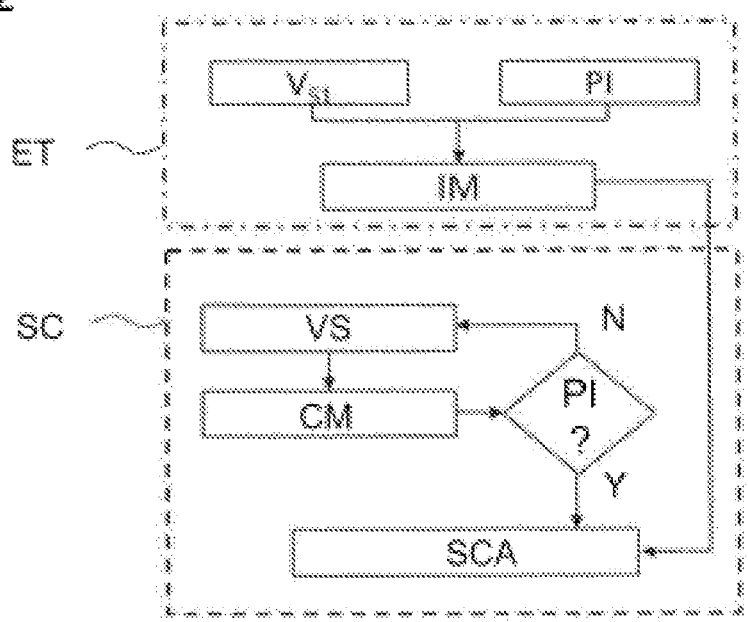
Figure 3:
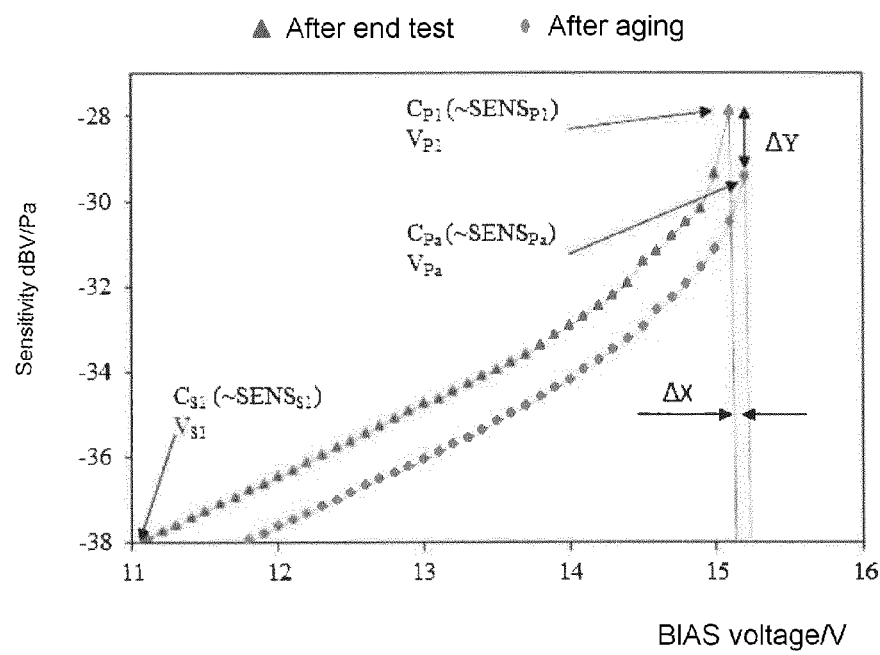
Figure 4:
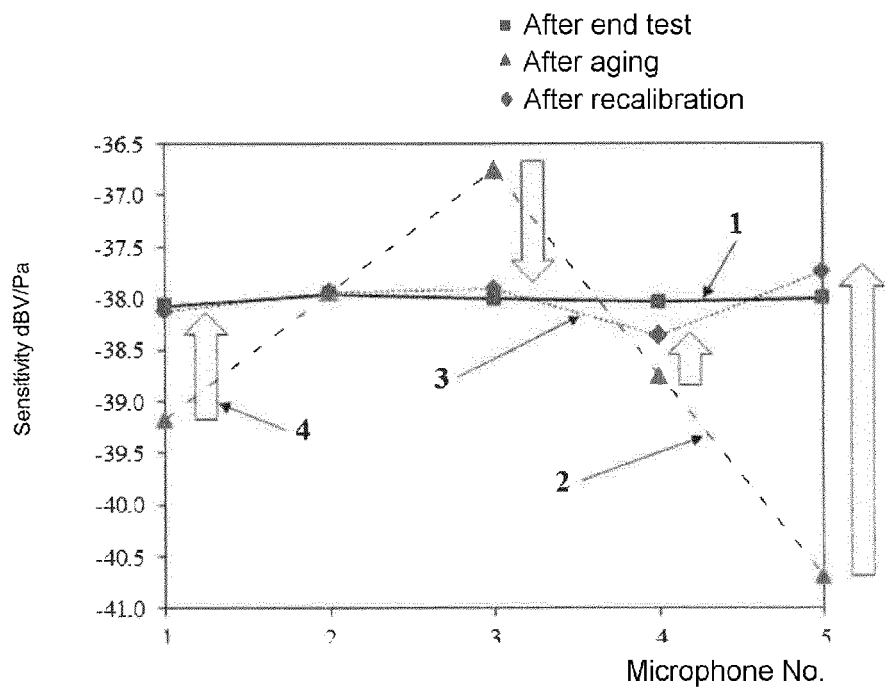

FIG. 1 shows the schematic construction of a MEMS microphone according to the invention with self-calibration, FIG. 2 shows a schematic method sequence when carrying out the end test and the self-calibration, FIG. 3 shows in a diagram the dependence of the capacitance of the MEMS sensor on the applied BIAS voltage after the end test and after aging, FIG. 4 shows, for five different MEMS microphones, the sensitivity set after the end test, and also the sensitivities determined after soldering and after recalibration.

FIG. 1 shows the schematic construction of a MEMS microphone MIC according to the invention. Said MEMS microphone comprises a MEMS sensor MS and an ASIC AS, both of which are configured as chip components and can preferably be arranged alongside one another or one above another on a common carrier. The core element of the MEMS microphone MIC is the MEMS sensor MS, which is configured as a microminiaturized capacitance comprising a movable electrode (membrane) and one or two fixed electrodes. The capacitance C or the change in capacitance delta C of the MEMS sensor MS is detected by means of a device for capacitance measurement CM and is converted into a voltage representing a measure of the deflection of the membrane and thus of the strength of the received acoustic signal.

With the aid of a BIAS voltage generator BS, a desired BIAS voltage of e.g. between 8-16 V is generated and applied in the MEMS sensor MS between membrane and fixed electrode. A suitable BIAS voltage is approximately 12 volts, for example. The signal tapped off at an electrode of the MEMS sensor MS, e.g. the capacitance or change in capacitance and the voltage signal generated therefrom in the ASIC) is forwarded via an amplifier AMP to an output OUT of the MEMS microphone MIC.

Furthermore, the ASIC comprises a device for self-calibration SC, which is configured for example as a programmable logic circuit. This logic circuit processes data supplied by the capacitance measurement CM and compares them with data stored in an internal memory IM.

As a result of the self-calibration, a recalibrated BIAS voltage $VS_{new}$ is obtained, in the case of which the sensitivity of the MEMS microphone has been brought close to a target value again. The measurement values at the new operating point can then likewise be stored in the internal memory IM. In any case the BIAS voltage $VS_{new}$ ascertained during the recalibration for an optimum operating point is conducted to the BIAS voltage generator BS, which generates and correspondingly sets said voltage at the MEMS sensor MS.

The ASIC is configured as an integrated circuit and embodied for example on the basis of silicon CMOS technology or gallium arsenide. However, other technologies for realizing the desired functions of the ASIC are also possible.

FIG. 2 shows a schematic method sequence as to how the self-calibration of the MEMS microphone according to the invention can be carried out. Upstream of the self-calibration there is an end test ET that is carried out directly after the manufacture of the MEMS sensor MS in a defined acoustic environment. It is also possible, of course, to perform this end test or a first calibration at an arbitrary later point in time, possibly even only after the installation of the microphone in a desired device, e.g. a cellular phone.

The end test ET involves measuring the sensitivity of the MEMS sensor MS depending on the BIAS voltage present. The measurement is carried out until the pull-in point PI is reached, at which the measured sensitivity (or the capacitance or change in capacitance) makes the jump already mentioned or at least experiences a great dip. The desired sensitivity/capacitance, and in particular the first operating voltage VS: required therefor, is stored in the internal memory IM, as is the first operating capacitance $CS_1$ of the MEMS sensor that is measured at the operating point. Corresponding data are determined for the pull-in point and stored. It is assumed that the capacitance represents a measure of the sensitivity.

A self-calibration SC is then accomplished with the aid of these data stored in the internal memory IM and with the aid of the arrangement set out by way of example in FIG. 1. In this case, firstly, the BIAS voltage present at the MEMS sensor MS is increased in steps with the aid of a voltage generator VS. A capacitance measurement CM or a measurement of the change thereof is carried out in the case of each step. In a logic circuit, on the basis of the measured capacitance/change in capacitance at the set BIAS voltage a check is then made to establish whether the pull-in point PI is reached. If the pull-in point has not yet been reached (N), the BIAS voltage is increased once again by a step in the BIAS voltage generator VS. If the logic circuit reveals that the pull-in has been reached at a BIAS voltage present (Y), then the values are fed into a self-calibration algorithm SCA. These values are compared with the data from the end test stored in the internal memory IM, said data likewise representing parameters for the self-calibration algorithm. As a result of the self-calibration, a recalibrated operating voltage $VS_{new}$ is obtained, stored in the internal memory IM and used as an invariable BIAS voltage for the further operation of the MEMS microphone as long as no recalibration is carried out.

After a predefined time, and/or after specific conditions have been reached, and/or upon request by a microphone user, a self-calibration can once again be carried out. In this case in turn the data for the present pull-in point are measured and compared with the corresponding data from the end test ET by means of the self-calibration algorithm and a recalibrated BIAS voltage is ascertained and taken as a basis for the further operation of the MEMS microphone.

FIG. 3 shows the dependence of the microphone sensitivity, measured in dBV/Pa, on the BIAS voltage present, measured in volts, said dependence being ascertained in the end test. These measurement points, represented by triangles, yield the upper curve in the figure.

A desired target sensitivity is then set, this lying at −38 dBV/PA, for example. A BIAS voltage of approximately 11.1 volts, for example, is required here for setting this sensitivity. In parallel with the actual sensitivity, the capacitance/change in capacitance of the MEMS sensor that is proportional thereto is also ascertained during the end test, and this has a first operating capacitance $CS_1$ at the set first operating point at the first operating voltage $VS_1$. An illustration of the corresponding capacitance scale is dispensed with in the present diagram, however, for the sake of clarity.

After thermal or mechanical loading or other aging of the MEMS microphone, for example after the soldering of the microphone into a circuit environment, a first self-calibration is then carried out. To that end, the present pull-in point of the MEMS microphone is ascertained by the method illustrated schematically in FIG. 2. Said pull-in point lies at a present pull-in capacitance $CP_a$ that occurs at a present operating voltage $VP_a$. This pull-in point differs from the first operating pull-in point both in respect of the BIAS voltage required therefor and in respect of the present pull-in capacitance measured in this case. The deviation is ΔX for the voltage and ΔY for the capacitance/change in capacitance.

For the recalibration, it is then necessary to compensate for the two deviations ΔX and ΔY. To that end, firstly, the BIAS voltage present is shifted by the directly readable value ΔX. For the compensation of the Y-drift ΔY it is assumed that the sensitivity of the MEMS microphone depending on the BIAS voltage present after aging (lower curve) behaves similarly to the upper curve determined exactly in the end test.

The number of steps is then taken which are necessary during the voltage increasing by constant values in order to pass from the value of the first operating voltage $VS_1$ to reaching the pull-in at the first pull-in voltage $VP_1$. The voltage difference corresponding to said number is then used as a further summand for ascertaining the recalibrated operating voltage. The aim is to set the operating voltage such that the desired target sensitivity of here −38 dBV/Pa is attained again as accurately as possible. In this case, the self-calibration algorithm represents only an approximation since the result attained, that is to say the sensitivity actually set after recalibration, is indeed better approximated to the target value, but can still deviate therefrom. However, an exact ascertainment of the sensitivity of the microphone is not possible during the self-calibration.

In order to check the success of the self-calibration, a number of here five different MEMS microphones are taken and subjected to an end test and a first calibration. After this first calibration to a desired first operating point, all five microphones have virtually the same target sensitivity of −38 dBV/Pa. The deviation here is only 0.05 dBV/PA. The line 1 links the set actual sensitivities of the five microphones and deviates only insignificantly from a horizontal straight line.

After the MEMS microphone has been soldered into a circuit environment, a new exact measurement of the microphone sensitivity is carried out at the set first operating voltage. The line 2 links the measurement points for the five microphones. It is clearly evident that the line 2 deviates distinctly from the ideal line or the original distribution 1 of the set microphone sensitivity. A deviation of the sensitivity of +/−1.97 dBV/Pa results for the five microphones. Such a deviation is unacceptable for high-performance microphones.

A self-calibration according to the invention is then carried out in each case on all five microphones. This involves ascertaining a recalibrated operating voltage for the respective microphone and applying it to the MEMS sensor. A sensitivity measurement is then carried out once again for the five microphones recalibrated in this way. The line 3 links the measurement points for the five recalibrated microphones. It is found that the recalibrated sensitivities are well approximated again to the sensitivities originally determined and set. The attained deviation is on average only +/−0.31 dBV/Pa. From the diagram, this can also be discerned purely visually from the approach of the curve 2 to the original curve 1. The arrows 4 illustrate the extent of the improvement in respect of how greatly the sensitivity was able to be altered in the desired direction by the recalibration according to the invention. This shows the success of the method according to the invention.

Although the invention has been described only on the basis of one exemplary embodiment, it is not restricted thereto. Both analogue and digital capacitively operating MEMS microphones can be calibrated by the method according to the invention, wherein the calibration can be carried out automatically and/or at the user's request. The implementation of the self-calibration method according to the invention necessitates merely insignificant extensions of the ASIC architecture, such that the MEMS microphone according to the invention requires merely an insignificantly increased hardware outlay. Thus, the microphone according to the invention is made only insignificantly more expensive, while the self-calibration method according to the invention can be carried out in an automated manner and rapidly, and likewise does not require relatively high additional expenditure in terms of time or energy.

LIST OF REFERENCE SIGNS

MIC MEMS microphone
$VP_1$ First pull-in voltage
BS BIAS voltage generator
$VS_1$ First operating voltage at the first operating point
$CS_1$ First operating capacitance
$CP_1$ First pull-in capacitance at the first pull-in point
$VP_1$ First pull-in voltage
IM Internal memory
$VP_a$ Present pull-in voltage
$CP_a$ Present pull-in capacitance
$VS_{new}$ Recalibrated BIAS voltage
MS MEMS sensor
AS ASIC
AMP Amplifier
CM Capacitance measurement
SC Self-calibration
OUT Microphone output
VDD Supply voltage
GND Ground
CLK Clock
W/R Write/read input
VS Voltage change
P1 Pull-in
1 Desired sensitivity
2 Sensitivity after soldering
3 Sensitivity after self-calibration
4 Shift in sensitivity
ΔX X-drift of the pull-in point
ΔY Y-drift of the pull-in point

The invention claimed is:

1. A method for recalibrating a capacitively operating MEMS microphone,
wherein the BIAS voltage present at a MEMS microphone is increased step by step in order to ascertain the present pull-in voltage $VP_a$ and the corresponding pull-in capacitance $CP_a$ or the change in capacitance associated with the present increase in the bias voltage at a pull-in point of the MEMS microphone,
wherein from the deviation of the present pull-in point from the values of a first pull-in point, said values being determined after an end test and stored in an internal memory of the MEMS microphone, and the values $CS_1$, $VS_1$ of a first operating point and a recalibrated bias voltage $VS_{new}$ is determined and set in order thereby to bring a sensitivity of the MEMS microphone closer again to a desired sensitivity of the MEMS microphone originally set at the first operating point.

2. The method according to claim 1,
wherein the end test is carried out directly after the production of the MEMS microphone, comprising ascertaining the first pull-in voltage $VP_1$,
setting the operating point in accordance with the desired sensitivity of the MEMS microphone by varying the bias voltage at a first operating voltage $VS_1$,
ascertaining the first pull-in capacitance $CP_1$ of the MEMS microphone at the first pull-in voltage $VP_1$ and the first operating capacitance $CS_1$ at the first operating voltage $VS_1$ or alternatively the corresponding changes in the observed value, the change in capacitance associated with the present increase in the bias voltage at the pull-in point, storing the values $CS_1$, $VS_1$, $CP_1$ and $VP_1$ in an internal memory of the MEMS microphone, wherein a first recalibration is carried out after the installation of the MEMS microphone in a circuit environment.

3. The method according to claim 2, wherein the recalibrated bias voltage $VS_{new}$ is calculated according to the formula $$VS_{new}=VS_1-(VP_1-VP_2)+(CP_1-CP_2)*(VP_3-VP_2)/(CP_1-CP_2).$$

4. The method according to claim 2, wherein the recalibration is carried out repeatedly, wherein the values $CS_1$, $VS_1$, $CP_1$ and $VP_1$ determined after the end test are used in each case as reference.

5. The method according to claim 1, wherein the desired sensitivity and also the values for the first operating point and the first pull-in point are determined in a defined acoustic environment.

6. The method according to claim 1,
wherein the MEMS microphone carries out a recalibration
automatically according to specific rules depending on the acoustic or thermal stress loading of the MEMS microphone, or
automatically when a specific time interval has elapsed, or
if the recalibration is initiated manually by a user, or
after every restart of the device in which the microphone is installed.

7. The method according to claim 1, wherein both in the end test and during the recalibration the bias voltage is increased in steps until the pull-in point is reached, and wherein the respective capacitance or change in capacitance is determined during each step, wherein, when the pull-in point is reached, the capacitance of the MEMS microphone reaches a high value or makes a jump and the values used and stored as pull-in voltage $VP_a$ and pull-in capacitance $CP_a$ or change in pull-in capacitance are the last values in each case before the pull-in point is reached.

8. A MEMS microphone with self-calibration device,
comprising a capacitively operating MEMS sensor, to which a bias voltage is able to be applied, and
comprising an ASIC connected to the MEMS sensor,
wherein the ASIC is designed for the following steps
a) carrying out a step by step increase in the bias voltage,
b) determining the change in capacitance or the capacitance that forms in each case at the MEMS sensor,
c) ascertaining a present pull-in point by way of the capacitance measurement,
d) storing the measurement values for bias voltage and associated capacitance or change in capacitance at a first pull-in point ascertained at an earlier first measurement of the MEMS sensor in an internal memory,
e) carrying out an algorithm for calculating a recalibrated bias voltage $VS_{new}$ using the presently determined measurement values and the already stored measurement values measured at the first pull-in point,
f) applying the recalibrated BIAS voltage $VS_{new}$ to the MEMS microphone.

* * * * *